(12) United States Patent
Aimone et al.

(10) Patent No.: US 7,666,243 B2
(45) Date of Patent: Feb. 23, 2010

(54) FINE GRAIN NIOBIUM SHEET VIA INGOT METALLURGY

(75) Inventors: Paul R. Aimone, Bridgewater, MA (US); Kurt D. Moser, Millis, MA (US); Robert A. Dorvel, Wrentham, MA (US); Ryan Balter, Framingham, MA (US)

(73) Assignee: H.C. Starck Inc., Newton, MA (US)

( * ) Notice: Subject to any disclaimer, the term of this patent is extended or adjusted under 35 U.S.C. 154(b) by 715 days.

(21) Appl. No.: 10/974,519

(22) Filed: Oct. 27, 2004

(65) Prior Publication Data

US 2006/0086438 A1 Apr. 27, 2006

(51) Int. Cl.
*C22B 9/20* (2006.01)
(52) U.S. Cl. ............................................. 75/10.23
(58) Field of Classification Search ............ 75/10.23; 148/538, 565
See application file for complete search history.

(56) References Cited

U.S. PATENT DOCUMENTS

| | | | |
|---|---|---|---|
| 3,269,825 A * | 8/1966 | Vordahl | 75/302 |
| 3,269,826 A * | 8/1966 | Bumgarner | 75/10.65 |
| 3,565,602 A * | 2/1971 | Konisi et al. | 75/10.26 |
| 3,933,474 A * | 1/1976 | Ham et al. | 75/10.26 |
| 5,171,379 A | 12/1992 | Kumar et al. | |
| 5,498,186 A | 3/1996 | Benz et al. | |
| 5,580,516 A | 12/1996 | Kumar | |
| 5,699,401 A | 12/1997 | Jackson et al. | |
| 5,846,287 A | 12/1998 | Kumar et al. | 75/10.23 |
| 6,004,368 A | 12/1999 | Chandley et al. | |
| 6,334,912 B1 | 1/2002 | Ganin et al. | 148/419 |
| 6,348,113 B1 | 2/2002 | Michaluk et al. | 148/668 |
| 6,540,851 B2 * | 4/2003 | Huber et al. | 148/538 |
| 6,576,069 B1 | 6/2003 | Huber, Jr. et al. | 148/432 |
| 2002/0026965 A1 | 3/2002 | Michaluk et al. | 148/422 |
| 2002/0072475 A1 | 6/2002 | Michaluk et al. | |
| 2002/0112789 A1 | 8/2002 | Jepson et al. | |
| 2003/0019106 A1 | 1/2003 | Pope et al. | 29/898 |
| 2006/0086438 A1 | 4/2006 | Aimone et al. | |
| 2007/0044873 A1 | 3/2007 | Aimone | |

FOREIGN PATENT DOCUMENTS

| | | |
|---|---|---|
| WO | WO-92/20828 | 11/1992 |
| WO | WO-01/96620 | 12/2001 |
| WO | WO-02/088412 | 11/2002 |

OTHER PUBLICATIONS

ASTM E112-88, "Standard Test Methods for Determining Average Grain Size" (published on Aug. 26, 1988).
Notice of Opposition in European Patent Application No. EP 050220300.7.

* cited by examiner

*Primary Examiner*—Roy King
*Assistant Examiner*—Ngoclan Tmai
(74) *Attorney, Agent, or Firm*—Connolly Bove Lodge & Hutz LLP (57) ABSTRACT

A method of making a silicon-containing alloy of niobium that includes:
  A) forming a blend comprising niobium powder and silicon powder and pressing the blend to form pressed blend;
  B) attaching the pressed blend to an electrode comprising niobium;
  C) melting the electrode and pressed blend under vacuum arc remelting conditions, such that the blend mixes with the melted electrode;
  D) cooling the melted electrode to form an alloy ingot; and
  E) applying thermo-mechanical processing steps to the alloy ingot to form a wrought product.

The method provides a fully recrystalized niobium wrought product with a grain size finer that ASTM 5, that can be used to make deep drawn cups and sputtering targets.

6 Claims, 7 Drawing Sheets

FINE GRAIN NIOBIUM SHEET VIA INGOT METALLURGY

BACKGROUND OF THE INVENTION

1. Field of the Invention

The present invention relates to a process for manufacturing a niobium plates or sheets as well as uses thereof, such as for deep drawn cups and sputtering targets.

2. Description of the Prior Art

Niobium ingots can be rolled to plate and sheet dimensions using known methods in the art. Such plates and sheets can be used, for example, by being deep drawn into cups for the synthetic diamond industry. The niobium foil used typically has an inconsistent and coarse grain size, which leads to poor flatness and smoothness of the deep drawn cup bottom. Poor flatness and/or smoothness (orange peel) results in a synthetic diamond that requires excessive grinding to correct deficiencies. The problem ultimately relates to a coarse grain structure in the niobium sheet. The coarse grain structure can also cause tearing of the sheet during deep-draw operations.

The grain size of typical, commercially available niobium sheet is variable, ranging from an ASTM grain size of from 4 to 10. It is, however, desirable to use niobium sheet with an ASTM grain size finer than 7.5 with at least 90% recrystallization for deep draw applications, although this still produces a high rejection rate for flatness and surface finish. An ASTM grain size finer than 8.0 with at least 90% recrystallization almost completely eliminates these issues.

It would be desirable to provide a method of producing niobium sheet having a consistent ASTM grain size and sufficient recrystallization to minimize or prevent flatness and/or smoothness problems with the sheet.

SUMMARY OF THE INVENTION

The present invention is directed to a method of making a silicon-containing alloy of niobium. The method includes:
A) forming a blend comprising niobium powder and silicon powder and pressing the blend to form pressed blend;
B) attaching the pressed blend to an electrode comprising niobium;
C) melting the electrode and pressed blend under vacuum arc remelting conditions, such that the blend mixes with the melted electrode;
D) cooling the melted electrode to form an alloy ingot; and
E) applying thermo-mechanical processing steps to the alloy ingot to form a wrought product.

The present invention is also directed to a niobium containing wrought product prepared according to the above-described method.

The present invention is additionally directed to deep drawn cups and sputtering targets made from the silicon modified niobium wrought products described above.

DETAILED DESCRIPTION OF THE INVENTION

Other than in the operating examples, or where otherwise indicated, all numbers or expressions referring to quantities of ingredients, reaction conditions, etc. used in the specification and claims are to be understood as modified in all instances by the term "about."

The present invention relates to a method for manufacturing niobium wrought products. The method provides a significant reduction as well as better control of the final grain size in niobium wrought products. More particularly, the present invention provides niobium wrought products that contain greater than 5 ppm silicon, which has a consistently fine, uniform, and fully recrystallized grain structure.

As used herein, the term "wrought products" refers generally to metals that have been exposed to thermo-mechanical processing steps to acquire a specific shape and/or other properties. The thermal steps can include, but are not limited to annealing, baking, smelting and/or melting. The mechanical steps can include, but are not limited to working, forging, rolling, upset forging, upset-and-forge-back techniques, hammer forging, drawback forging, flat forging, round forging, and radial forging.

Wrought products, as provided in the present invention include, but are not limited to generally planar metal forms such as foils (less than about 10 mil in thickness), sheets (from about 10 to about 125 mil in thickness), and plates (greater than about 125 mil in thickness. Other wrought product forms can include tubes, where a length of metal is hollow in the center (and can have any cross-sectional internal and external shape, but often those shapes will be circular, oval, square, rectangular, triangular, hexagonal, or octagonal); and rods, which are lengths of metal that are solid throughout and can have any cross-sectional internal and external shape, but often those shapes will be circular, oval, square, rectangular, triangular, hexagonal, or octagonal.

In the invention, vacuum arc remelting is used to alloy niobium with low level silicon additions along with traditional thermo-mechanical processing with higher annealing temperatures to produce niobium wrought products with a fine and fully recrystallized grain structure. The inventive process provides high yields, a more consistent product, and lower manufacturing costs.

In an embodiment of the present invention, the silicon is present at a level of at least 0.01 ppm, in some cases 0.1 ppm and as high as 60 ppm, in some cases 50 ppm based on the total niobium in the niobium ingot. The amount of silicon in the niobium can be any value or can range between any of the values recited above.

In the present method, a blend containing niobium powder and silicon powder is formed and pressed to form a pressed blend. As used herein, the term "pressed blend" refers to a solid form where a mixture of materials are compressed to form a stable shape, which is capable of being attached to another body, such that when the other body melts, the pressed blend melts and commingles with the elements of the other body.

The pressed blends are attached to electrodes that contain niobium using a suitable method and both are melted under vacuum arc remelting (VAR) conditions and subsequently cooled. In other words, the niobium acts as an electrode, and is melted by striking an arc between a charged electrode and the niobium, under vacuum. The arc power can be from 25 to 50V and from 7,000 to 10,000 amps.

Typically, a pressed blend of niobium and silicon is used with a niobium electrode.

The melted electrode and pressed blend is cooled to form an alloy ingot.

Thermo-mechanical processing steps as indicated above are applied to the alloy ingot to form a wrought product as described above.

After forging, the alloy ingot can be vacuum annealed at a temperature of at least 950° C. and up to 1150° C. The annealing temperature for the wrought product can be any value or range between the values recited above.

The annealing step can take at least 5 minutes and up to 180 minutes. The length of time for annealing can be any value or can range between any values recited above.

The annealing step can result in at least 75% recrystallization and in some cases up to at least 95% recrystallization.

In an embodiment of the invention, sequential rolling and annealing steps can be carried out on the alloy ingot. Any suitable combination of rolling and annealing steps can be used. In a particular embodiment of the invention, the following steps are used:

I) rolling the wrought product to an intermediate thickness;
II) annealing the wrought product of I) at a temperature of from 950 to 1150° C. for a period of from 30 minutes to 180 minutes;
III) rolling the wrought product of II); and
IV) annealing the wrought product of III) at a temperature of from 950 to 1150° C. for a period of from 30 minutes to 180 minutes and then cooling the wrought product to room temperature.

In an embodiment of the invention, the intermediate thickness I) can be from 0.5 to 2 cm and the wrought product III) can have a thickness of from 0.005 to 0.24 cm.

A particular embodiment of the invention provides a method of making a silicon-containing alloy of niobium by a) melting niobium to form a melt;
b) adding 0.1 to 60 ppm of silicon, based on the niobium in the melt;
c) cooling the melt to form an alloy ingot;
d) applying thermo-mechanical processing steps to the alloy ingot to form a wrought product.

The thermo-mechanical processing steps in d) can include i) forging the alloy ingot to form a wrought product; and ii) annealing the wrought product at a temperature of from 950 to 1150° C.

Particular sequential rolling and annealing steps can be used in this particular embodiment as described above. The annealing steps can result in at least 75% recrystallization and in some cases up to at least 95% recrystallization.

In an alternative embodiment, scrap niobium is consolidated via VAR, ISM, or other cold hearth melting techniques and a silicon addition made directly to the melt or via the VAR process described above.

In the present invention, the cooled, annealed plate and sheet has a fine and uniform ASTM grain size up to 10, and can be as coarse as 5. In an embodiment of the invention, the ASTM grain size is in the range of 8 to 10.

The present invention also provides for wrought product made according to the above described processes, where the wrought products are selected from a foil, a sheet, a plate, a tube, and a rod.

The present invention also provides for deep drawn cups or sputtering targets obtained using, made from, or including the above-described wrought products.

The present invention will further be described by reference to the following examples. The following examples are merely illustrative of the invention and are not intended to be limiting. Unless otherwise indicated, all percentages are by weight.

EXAMPLES

Niobium ingot were obtained that contained approximately 0.57 ppm Si, 5.3 ppm Mo, 1200 ppm Ta, other minor (less than 1 ppm) impurities with the balance being niobium.

Pressed blends of Niobium/silicon powders were prepared and attached to each respective electrode. The electrodes and pressed blends were melted under vacuum arc remelting conditions under argon atmosphere and cooled to form an ingot. The ingots were then forged to sheet bar and rolled to 0.030 inches (0.076 cm) thick sheet and annealed at 1950° F. (1066° C.) for 90 minutes. This sheet was then rolled to 0.010 inches (0.025 cm) thick and individual samples were annealed according to one of the following conditions:

(i) 1800° F. (982° C.) for 90 minutes,
(ii) 1850° F. (1010° C.) for 90 minutes,
(iii) 1900° F. (1038° C.) for 90 minutes,
(iv) 1950° F. (1066° C.) for 90 minutes,
(v) 2000° F. (1093° C.) for 90 minutes,
(vi) 2050° F. (1121° C.) for 90 minutes, and
(vii) 2100° F. (1149° C.) for 90 minutes.

The following table shows the results from Glow Discharge Mass Spectrometry (GDMS) and Inductively Coupled Plasma Mass Spectrometry (ICP) analyses from surface samples of niobium ingots. The results for the GDMS analyses only include those elements that, in at least one sample, had a concentration above detectability limits. VAR processing of the electrodes neither substantially increased nor decreased the concentrations of the elements listed in the table.

| GDMS[1] Results for Metallic Elements | | | | | |
|---|---|---|---|---|---|
| Ingot ID | | | | | |
| Nb1 | Nb6 | Nb5 | Nb2 | Nb4 | Nb3 |
| Ingot Si Add'n, ppm | | | | | |
| 0 | 30 | 40 | 50 | 60 | 70 |
| Final Ingot Si, ppm | | | | | |
| 0 | 10 | 20 | 30 | 40 | 50 |

| | Nb1 | Nb6 | Nb5 | Nb2 | Nb4 | Nb3 |
|---|---|---|---|---|---|---|
| Si | 0.40 | 20 | 31 | 29 | 40 | 60 |
| B | 0.02 | 0.05 | 0.09 | 0.03 | 0.09 | 0.05 |
| Na | 0.02 | <0.01 | <0.01 | 0.03 | <0.01 | <0.01 |
| Al | 0.07 | 0.07 | 0.05 | 0.09 | 0.15 | 0.08 |
| P | 0.37 | 0.75 | 0.75 | 2.1 | 0.52 | 1.9 |
| S | 0.53 | 0.01 | 0.05 | 0.92 | 0.05 | 0.53 |
| Cl | <0.01 | <0.01 | 0.05 | <0.01 | <0.01 | <0.01 |
| Ti | 0.08 | 0.05 | 0.07 | 0.06 | 0.04 | 0.03 |

-continued

GDMS[1] Results for Metallic Elements

| | Ingot ID | | | | | |
|---|---|---|---|---|---|---|
| | Nb1 | Nb6 | Nb5 | Nb2 | Nb4 | Nb3 |
| | Ingot Si Add'n, ppm | | | | | |
| | 0 | 30 | 40 | 50 | 60 | 70 |
| | Final Ingot Si, ppm | | | | | |
| | 0 | 10 | 20 | 30 | 40 | 50 |
| V | 0.02 | 0.04 | 0.02 | 0.02 | 0.02 | 0.01 |
| Cr | 0.03 | 0.07 | 0.05 | 0.05 | 0.05 | 0.03 |
| Mn | <0.005 | 1.1 | <0.005 | <0.005 | <0.005 | <0.005 |
| Fe | 0.15 | 0.05 | 0.49 | 0.42 | 0.27 | 0.51 |
| Co | <0.001 | 0.01 | 0.03 | 0.002 | <0.001 | 0.001 |
| Ni | 0.005 | 0.04 | 0.01 | 0.02 | 0.009 | 0.02 |
| Cu | <0.01 | <0.01 | 0.02 | 0.01 | 0.02 | 0.05 |
| Y | <0.001 | 0.003 | 0.003 | <0.001 | <0.001 | 0.005 |
| Zr | 0.21 | 0.19 | 0.19 | 0.21 | 0.15 | 0.22 |
| Nb | bal. | bal. | bal. | bal. | bal. | bal. |
| Mo | 4.5 | 4.3 | 4.5 | 4.3 | 3.8 | 3.7 |
| Hf | 0.03 | 0.02 | 0.02 | 0.04 | <0.01 | 0.02 |
| Ta | <=1000 | <=1000 | <=1000 | <=1000 | <=800 | <=1000 |
| W | 1.5 | 3.9 | 1.5 | 2.5 | 1.5 | 2.5 |
| | ICP Results for Interstitial Elements | | | | | |
| C | 5 | 8 | 8 | 4 | 5 | 7 |
| N | 6 | 4 | 8 | 12 | 9 | 4 |
| O | 33 | 28 | 31 | 58 | 33 | 42 |

[1]Glow Discharge Mass Spectrometry

Figure 1:
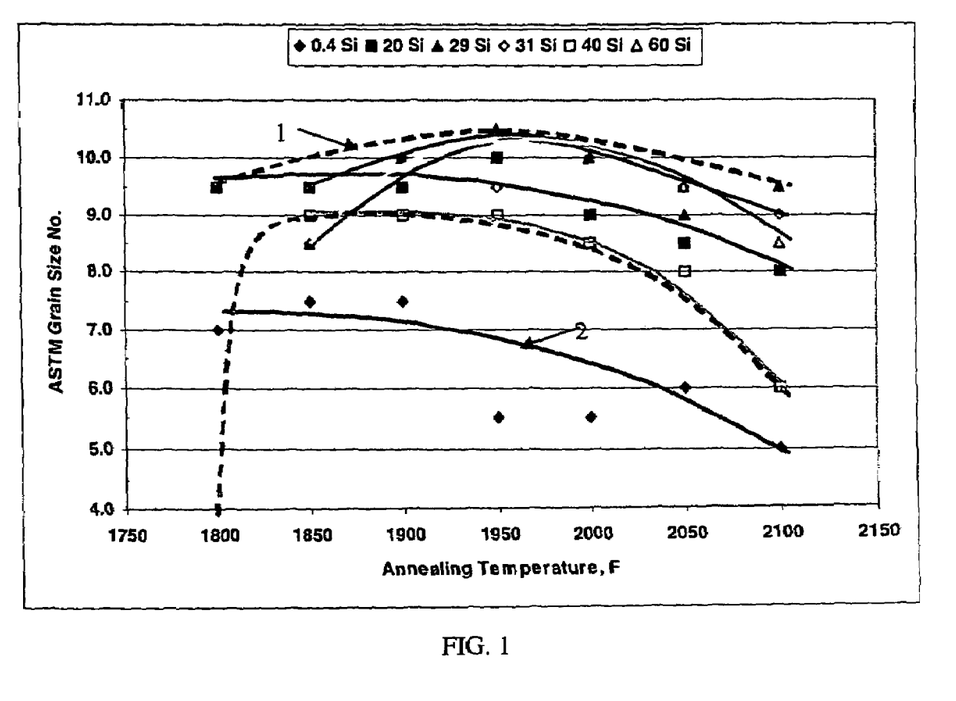
FIG. 1 is a graph showing the relationship of ASTM grain size with annealing temperatures for niobium sheets with varying silicon content.
Figure 2:
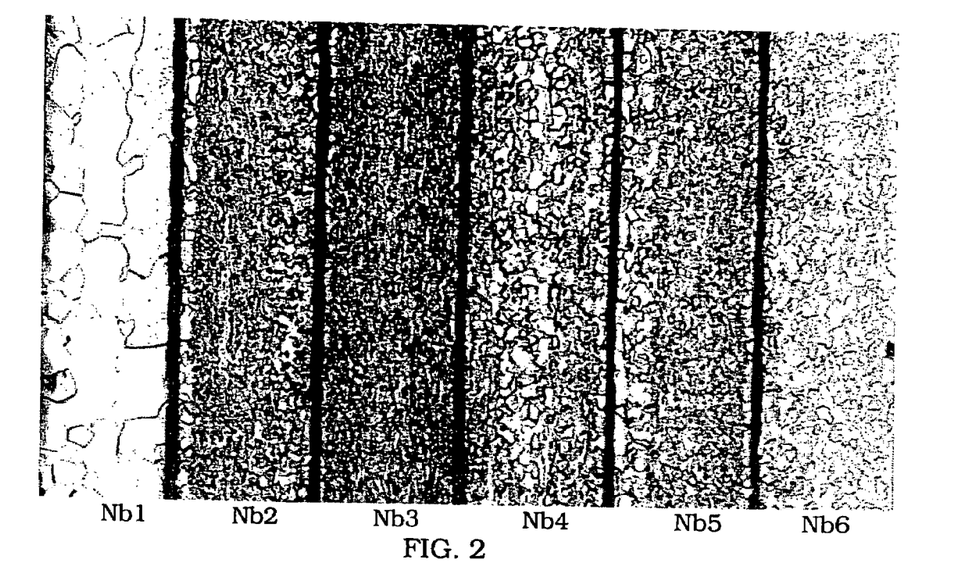
FIG. 2 shows micrographs of niobium sheets with varying silicon content.
Figure 3:
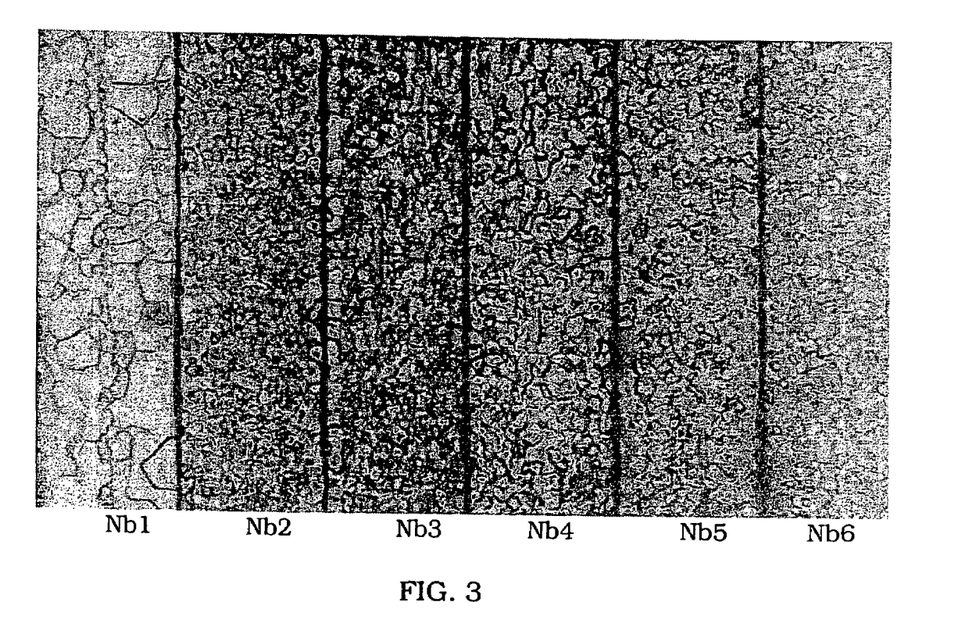
FIG. 3 shows micrographs of niobium sheets with varying silicon content.
Figure 4:
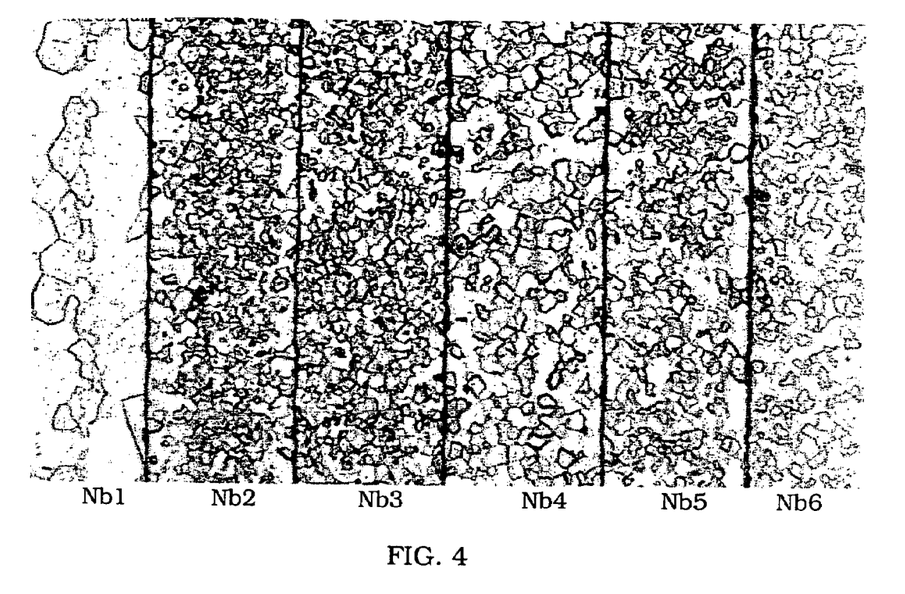
FIG. 4 shows micrographs of niobium sheets with varying silicon content.
Figure 5:
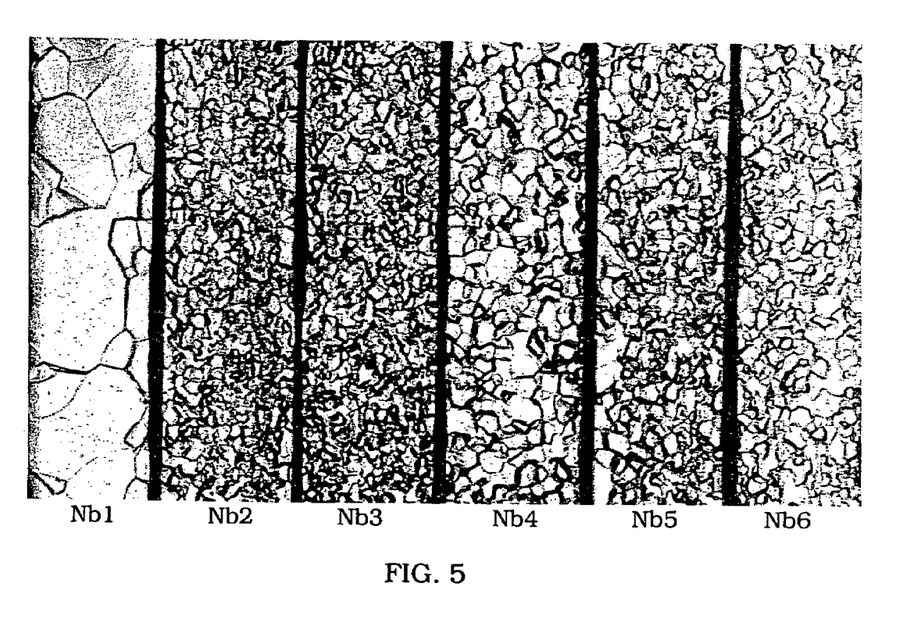
FIG. 5 shows micrographs of niobium sheets with varying silicon content.
Figure 6:
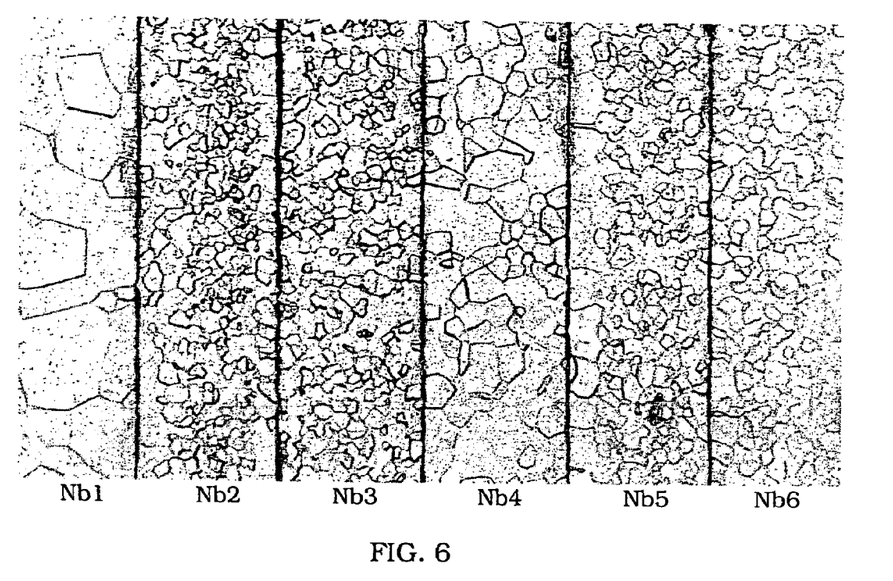
FIG. 6 shows micrographs of niobium sheets with varying silicon content.
Figure 7:
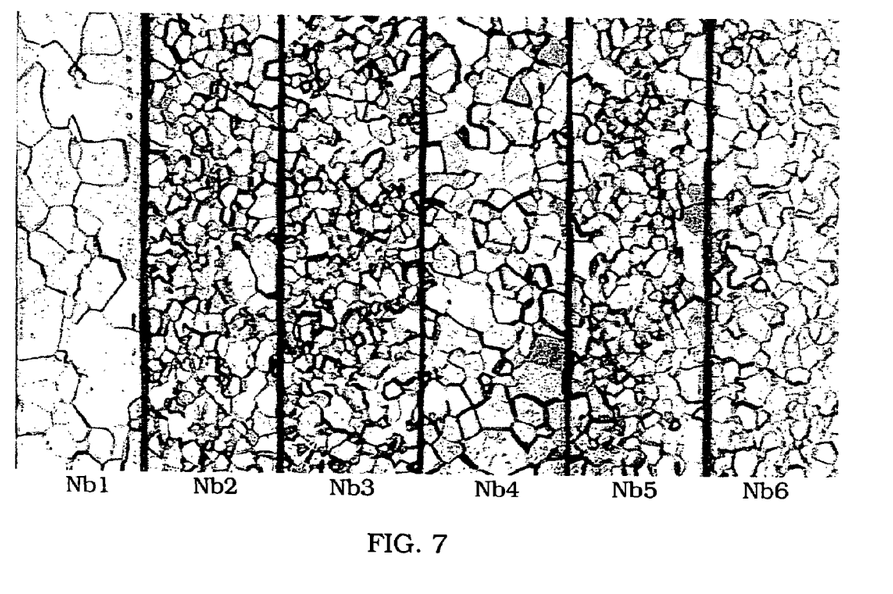
FIG. 7 shows micrographs of niobium sheets with varying silicon content.
Figure 8:
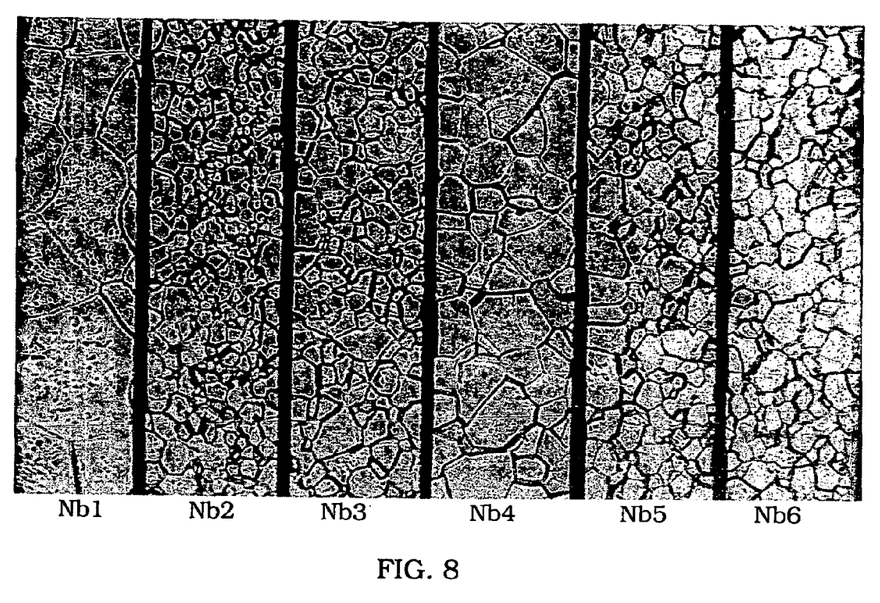
FIG. 8 shows micrographs of niobium sheets with varying silicon content.

Experience has indicated that an ASTM grain size of 8 or finer (as determined by ASTM Test Method E 112) with at least 90% recrystallization (determined by visual inspection) almost completely eliminates flatness and surface finish issues. FIG. 1 shows the results of the microstructural characterization of the niobium sheet samples. The legend in this and other figures shows the silicon content (ppm) of the sheet. The dashed lines (for example the line labeled 1) in FIG. 1 indicates the band of ASTM grain sizes for all the silicon modified samples independent of silicon content. FIGS. 2-8 show micrographs of the sheet samples. The micrographs were taken at a magnification of 100×. The samples were annealed as indicated below:

FIG. 2: 1800° F. (982° C.) for 90 minutes
FIG. 3: 1850° F. (1010° C.) for 90 minutes
FIG. 4: 1900° F. (1038° C.) for 90 minutes
FIG. 5: 1950° F. (1066° C.) for 90 minutes
FIG. 6: 2000° F. (1093° C.) for 90 minutes
FIG. 7: 2050° F. (1121° C.) for 90 minutes
FIG. 8: 2100° F. (1149° C.) for 90 minutes Previous research had shown there was considerable variation in the grain size (i.e., ASTM 4 to 10) of niobium sheet manufactured using prior art methods without silicon additions. FIG. 1 shows that without any silicon addition (see line 2) the finest grain size achieved was ASTM 7.5, which is only marginally acceptable for deep draw applications. With one exception (i.e., 20 ppm Si), greater than 90% recrystallization of the silicon modified sheet was not possible using the prior art production cycles. Consequently, grain sizes could not be determined. On the other hand, ASTM grain sizes of 8.5 or finer were consistently produced in niobium sheet containing silicon additions using annealing cycles 50° F. (28° C.) hotter than that those used in prior art production cycles. However grain coarsening began to occur at annealing temperatures of approximately 2000° F. (1093° C.). Grain sizes of ASTM 9.0 or finer were consistently produced in all silicon modified sheet samples using annealing temperatures between 1900° F. (1038° C.) and 2000° F. (1093° C.) with an optimum annealing temperature of 1950° F. (1066° C.).

Figure 9:
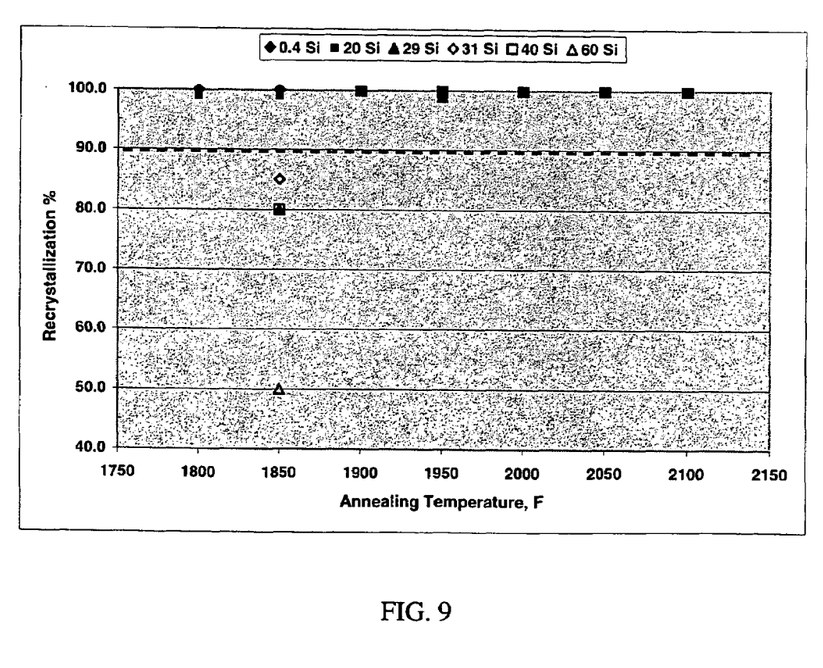
FIG. 9 is a graph showing the relationship of recrystallization with annealing temperature of niobium sheets with varying silicon content.

As the silicon content increases, annealing temperatures need to increase to fully recrystallize a sheet. FIG. 9 shows this trend (a dashed line indicates the 90% recrystallization target). Using the prior art production cycles, grain size measurements could only be performed on sheet samples with less than 20 ppm Si. Only at temperatures above 1900° F. (1038° C.) was full recrystallization of all of the silicon modified niobium sheet possible.

Not wishing to be bound to a single theory, it is believed, based on the results, that the silicon combines with niobium to form $Nb_3Si_5$ and/or $NbSi_2$ particles in the niobium or possibly with oxygen to produce sub-micron size $SiO2$. Rolling (cold working) to sheet produces a uniform dispersion of these particles that on subsequent annealing act initially as grain nucleation sites and, with continued annealing, as grain boundary pinning points.

Figure 10:
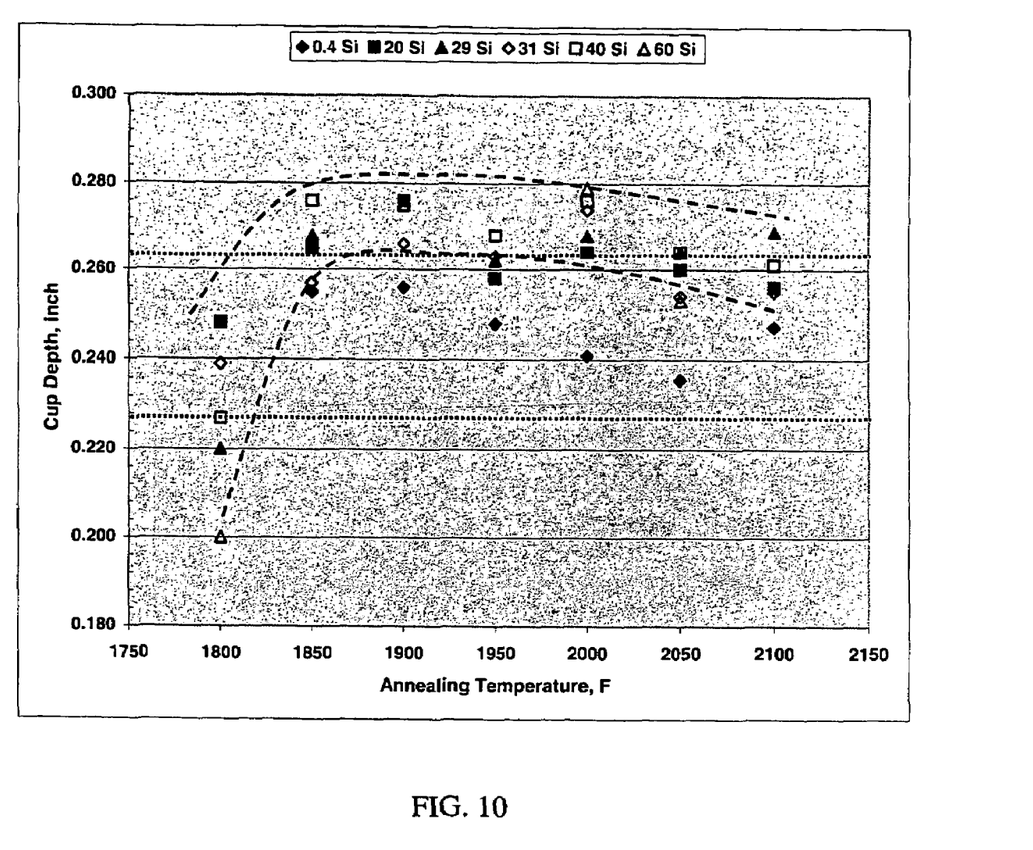
FIG. 10 is a graph showing the effect of annealing temperature and silicon content on cup depth.

FIG. 10 effect of annealing temperature and silicon content on Cup Depth, determined using the Olsen Ductility test (QM-1-1823). The dashed lines in FIG. 10 indicate the band of cup depths for all the silicon modified samples independent of silicon content. The dotted lines indicate the range (±1 σ) of cup depth measurements for 0.005 inch sheet from the prior art described above. The results clearly show that silicon modified niobium sheet has at least as good, if not slightly better, drawability than prior art niobium sheet. Additionally, the silicon modified niobium sheet maintains its drawability over almost the entire anneal temperature range evaluated, the exception being when the sheet is annealed using the prior art production cycle. This is also consistent with the effect of impurities on grain size and recrystallization as discussed above. Poorer recrystallization will reduce the ability of the niobium sheet to withstand large amounts of deformation. Consequently, the measured cup depth will be reduced.

Figure 11:
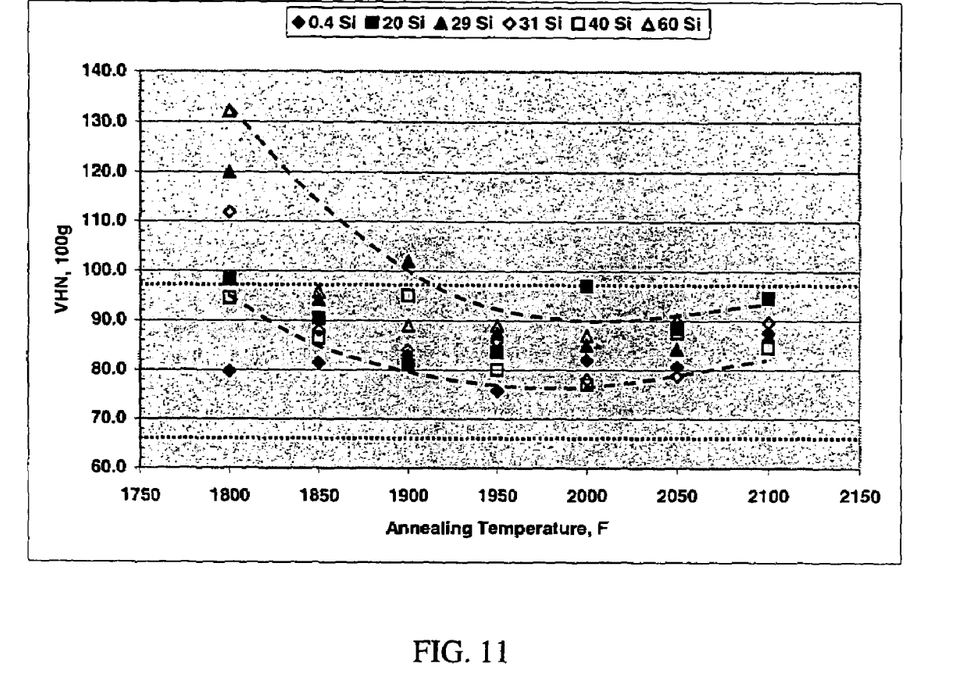
FIG. 11 is a graph showing the effect of annealing temperature and silicon content on Vicker's Hardness.

FIG. 11 shows effect of annealing temperature and Silicon Content on Vicker's Hardness, determined using an automated Vicker's Hardness Tester. The dashed lines in FIG. 11 indicate the band of hardness measurements for all the silicon modified samples independent of silicon content. The dotted lines indicate the range (±1 σ) of hardness measurements for 0.005" sheet from the prior art methods described above. If the data from the sheet annealed at 1800° F. is ignored because it was not fully recrystallized, then the hardness numbers for the silicon modified sheet fall within the upper half of the band from the previous work. This suggests that while on average the silicon modified sheet may be slightly harder than prior art sheet, it is still within the range typically seen for this material and has less variation.

Increasing the annealing temperature at all silicon contents has essentially no effect on the VHN.

Although the invention has been described in detail in the foregoing for the purpose of illustration, it is to be understood that such detail is solely for that purpose and that variations can be made therein by those skilled in the art without departing from the spirit and scope of the invention except as it may be limited by the claims.

What is claimed is:

1. A method of making a silicon-containing alloy of niobium comprising:
   A) forming a blend comprising niobium powder and silicon powder and pressing the blend to form pressed blend;
   B) attaching the pressed blend to an electrode comprising niobium C) melting the electrode and pressed blend under vacuum arc remelting conditions, such that the blend mixes with the melted electrode;

D) cooling the melted electrode to form an alloy ingot; and

E) applying thermo-mechanical processing steps to the alloy ingot to form a wrought product:

wherein the thermo-mechanical processing comprises:

i) forging the alloy ingot to form a wrought product; and ii) annealing the wrought product at a temperature of from 950 to 1150° C.; and wherein the annealing results in at least 75% recrystallization.

2. The method according to claim 1, wherein the wrought product in E) has a fine and uniform ASTM grain size of from 5 to 10.

3. The method according to claim 1, wherein the silicon is present in A) at from 0.1 to 100 ppm based on total niobium in the wrought product.

4. The method according to claim 1, wherein the wrought product is selected from the group consisting of foils, sheets, plates, tubes, and rods.

5. The method according to claim 1, wherein the thermo-mechanical processing steps in E) comprise:

I) rolling the wrought product to an intermediate thickness;

II) annealing the wrought product of I) at a temperature of from 950 to 1150° C. for a period of from 30 minutes to 180 minutes;

III) rolling the wrought product of II); and

IV) annealing the wrought product of III) at a temperature of from 950 to 1150° C. for a period of from 30 minutes to 180 minutes and then cooling the wrought product to room temperature.

6. The method according to claim 5, wherein the wrought product is selected from the group consisting of foils, sheets, plates, tubes, and rods.

* * * * *